(12) United States Patent
Schmid et al.

(10) Patent No.: US 10,566,764 B2
(45) Date of Patent: Feb. 18, 2020

(54) PLASMONIC QUANTUM WELL LASER

(71) Applicant: International Business Machines Corporation, Armonk, NY (US)

(72) Inventors: Heinz Schmid, Waedenswil (CH); Benedikt F. Mayer, Munich (DE); Stephan Wirths, Thalwil (CH); Kirsten Emilie Moselund, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/010,865

(22) Filed: Jun. 18, 2018

(65) Prior Publication Data
US 2019/0386453 A1    Dec. 19, 2019

(51) Int. Cl.
| | |
|---|---|
| *H01S 5/00* | (2006.01) |
| *H01S 5/10* | (2006.01) |
| *H01S 5/026* | (2006.01) |
| *H01S 5/042* | (2006.01) |
| *H01S 5/22* | (2006.01) |
| *H01S 5/02* | (2006.01) |
| *H01S 5/32* | (2006.01) |
| *H01S 5/343* | (2006.01) |
| *H01S 5/30* | (2006.01) |
| *H01S 5/347* | (2006.01) |

(52) U.S. Cl.
CPC ............ *H01S 5/1046* (2013.01); *H01S 5/021* (2013.01); *H01S 5/026* (2013.01); *H01S 5/042* (2013.01); *H01S 5/0422* (2013.01); *H01S 5/22* (2013.01); *H01S 5/32* (2013.01); *H01S 5/3013* (2013.01); *H01S 5/3018* (2013.01); *H01S 5/343* (2013.01); *H01S 5/347* (2013.01)

(58) Field of Classification Search
CPC .......... H01S 5/026; H01S 5/021; H01S 5/042; H01S 5/1046; H01S 5/22; H01S 5/0422; H01S 5/32; H01S 5/3013; H01S 5/3018; H01S 5/343; H01S 5/347
See application file for complete search history.

(56) References Cited

U.S. PATENT DOCUMENTS

| | | |
|---|---|---|
| 6,501,783 B1 | 12/2002 | Capasso et al. |
| 9,318,866 B2 | 4/2016 | Bora et al. |
| 9,356,427 B2 | 5/2016 | Lee et al. |
| 9,667,032 B1 | 5/2017 | Li et al. |

(Continued)

OTHER PUBLICATIONS

MA, R.-M., et al., "Room-Temperature sub-ffraction-limited plasmon laser by total internal reflection", Nature Materials, Published online Dec. 19, 2010, Feb. 2011, pp. 110-113, vol. 10.

(Continued)

*Primary Examiner* — Kinam Park
(74) *Attorney, Agent, or Firm* — Scully, Scott, Murphy & Presser, P.C.; Daniel P. Morris

(57) ABSTRACT

A plasmonic quantum well laser may be provided. The plasmonic quantum well laser includes a plasmonic waveguide and a p-n junction structure extends orthogonally to a direction of plasmon propagation along the plasmonic waveguide. Thereby, the p-n junction is positioned atop a dielectric material having a lower refractive index than material building the p-n junction, and the quantum well laser is electrically actuated. A method for building the plasmonic quantum well laser is also provided.

15 Claims, 6 Drawing Sheets

(56) References Cited

U.S. PATENT DOCUMENTS

| | | | | |
|---|---|---|---|---|
| 2003/0179974 | A1* | 9/2003 | Estes | B82Y 20/00 385/2 |
| 2010/0025673 | A1* | 2/2010 | Hu | H01L 33/06 257/43 |
| 2013/0070799 | A1 | 3/2013 | Lee et al. | |
| 2013/0148682 | A1 | 6/2013 | Zhang et al. | |
| 2018/0254611 | A1* | 9/2018 | Mayer | H01S 5/423 |

OTHER PUBLICATIONS

Sidiropoulos, T.P.H., et al., "Ultrafast plasmonic nanowire lasers near the surface plasmon frequency", Nature Physics, Published online Sep. 28, 2014, Nov. 2014, pp. 870-876, Sep. 28, 2014, vol. 10.

Oulton, R.F., et al., "Plasmon lasers at deep subwavelength scale", Nature, Received May 13, 2009, accepted Jul. 31, 2009, Published online Aug. 30, 2009, Oct. 1, 2009, pp. 629-632, vol. 461.

Ouan, X., et al., "Single-nanowire electrically driven lasers", Nature, Received Jul. 8, 2002, accepted Oct. 30, 2002, Jan. 16, 2003, pp. 241-245, vol. 421.

Qian, F., et al., "Multi-quantum-well nanowire heterostructures for wavelength-controlled lasers", Nature Materials, Published online Aug. 17, 2008, Sep. 2008, pp. 701-706, vol. 7.

Stettner, T., et al., "Coaxial GaAs—AlGaAs core-multishell nanowire lasers with epitaxial gain control", Applied Physics Letters, Received Oct. 22, 2015; accepted Dec. 22, 2015; published online Jan. 5, 2016, pp. 011108-1-011108-5, vol. 108.

Schmid, H., et al., "Template-assisted selective epitaxy of III-V nanoscale devices for co-planar heterogeneous integration with Si", Applied Physics Letters, Received Mar. 15, 2015; accepted Apr. 27, 2015; published online Jun. 8, 2015, 233101-1-233101-5, vol. 106.

Fadil, A., "Surface plaamon couplIng dynamics in InGaN/GaN quantum-well structures and radiative efficiency Improvement", Sci Rep, Received Jun. 24, 2014, Accepted Aug. 22, 2014, Published online Sep. 22, 2014, Accessed on Jul. 17, 2017, https://www.ncbi.nlm.nih.gov/pmc/articles/PMC4170193/, 9 pages.

Wang, J., et al., "Near-infrared hybrid plasmonic multiple quantum well nanowire lasers", Optics Express 9358, Received Jan. 20, 2017, Revised Apr. 3, 2017, Published Apr. 17, 2017, vol. 25, No. 8, https://www.osapublishing.org/DirectPDFAccess/24DE470E-BE7E-79CD-E84A6424028047DA_363019/oe-25-8-9358.pdf?da=1&id=363019&seq=0&mobile=no, 10 pages.

Li, Y., et al., "Electrically-pumped plasmonic lasers based on low-loss hybrid SPP waveguide", Optics Express 24843, Received Jul. 24, 2015, revised Aug. 31, 2015, accepted Sep. 9, 2015, published Sep. 11, 2015, vol. 23, No. 19, 7 pages.

\* cited by examiner

PLASMONIC QUANTUM WELL LASER

FIELD

The present disclosure relates generally to a plasmonic quantum well laser, and more specifically, to a plasmonic quantum well laser including a plasmonic waveguide. The disclosure relates further to a method for building a plasmonic quantum well laser.

BACKGROUND

Today's computing devices integration level is getting higher and higher with every generation of processing devices. The internal communication speed of such devices is pushing the physical limits to a maximum. As an alternative for an electrical signal-based communication, light of photon-based chip internal communication infrastructures are envisioned—and in some cases already practically used—to increase the bandwidth of chip-internal communication systems. Light as a communication medium may be used within one single semiconductor device layer or—in 3D chip designs—also as a means of communication from one layer to another layer of the same integrated circuit. In particular, for a communication within one single semiconductor device layer, low-loss surface plasmons might be foreseen as an alternative to photonic modes for short range (<100 um) communications as properties such as speed and confinement might outweigh the high optical absorption associated with the plasmonic waveguide. In such a scheme, plasmonic lasers may be instrumental as a candidate for a radiation-source in large-scale integrated (LSI) circuits using alternatives to pure electric communications aids.

Very recently, ultra-small lasers based on collective charge of selectors at the interface between the metal and a semiconductor, called surface plasmon polaritons (SPPs), have been proposed and experimentally demonstrated. However, the strong mode confinement of SPP's modes at the semiconductor-metal interface strongly reduces the overlap of active gain material with a propagating plasmon, while the presence of metal adds to the optical losses and a large fraction of bulk semiconductor material typically do not contribute to stimulated emission. The consequent increase of the lasing threshold together with inferencing plasmon propagation losses has rendered plasmon lasers inefficient compared to their photonic counterparts.

Photonic lasers, based on semiconductor quantum well structures, have already been proposed in the 1970s and have become one of the most important semiconductor laser technologies today. Although, the overlap of the optical modes with the quantum well gain material is reduced compared to bulk semiconductors, the high gain and temperature stability provided by quantum well gain material typically over-compensate these intrinsic current losses. A main limitation for achieving integration densities of photonic components compared to micro-electronics is the much larger size of photonic devices. A conventional semiconductor laser is typical of dimensions in the order of 100s or micrometers, which is about 10,000× greater than a typical electronic MOSFET switch in an advanced computing node. The ability to scale photonic components is limited by the diffraction of light, by dimension less than the wavelength of light in a given material; the optical mode will leak out.

Thus, there may be a need for VLSI chips to have a non-electric communication mechanism that requires less space than typical light-based photonic concepts.

SUMMARY

According to one aspect of the present invention, a plasmonic quantum well laser may be provided. The plasmonic quantum well laser may include a plasmonic waveguide. The plasmonic quantum well laser may comprise a p-n junction structure extending orthogonally to a direction of plasmon propagation along the plasmonic waveguide. The p-n junction may be positioned atop a dielectric material having a lower refractive index than the material building the p-n junction, and the quantum well laser may be electrically actuated.

According to another aspect of the present invention, a method for building a plasmonic quantum well laser may be provided. The method comprises providing a $SiO_2$ layer over a Si bulk material. A Si layer is deposited atop of the $SiO_2$ layer. The method may also comprise patterning an Si structure allotted for a gain region into the Si layer, such that the Si structure forms a pattern atop the $SiO_2$ layer, covering the Si structure with an $SiO_2$ template layer, and building an opening in the $SiO_2$ template layer from one side and etching away the Si pattern, thereby building a cavity within the $SiO_2$ template layer.

Furthermore, the method may comprise epitaxially growing horizontally a first semiconductor portion of a p-n junction extending from a silicon seed exposed within the $SiO_2$ template towards the opening until a predefined horizontal extension is reached, growing horizontally a second portion of the p-n junction through the opening extending from an end of the predefined horizontal extension facing the opening until the cavity is filled, such that the p-n junction builds the gain region of the plasmonic quantum well laser, and depositing a dielectric material over the p-n junction. Last but not least, the method may comprise depositing a plasmonic waveguide over the dielectric material along a longitudinal extension of the p-n junction.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
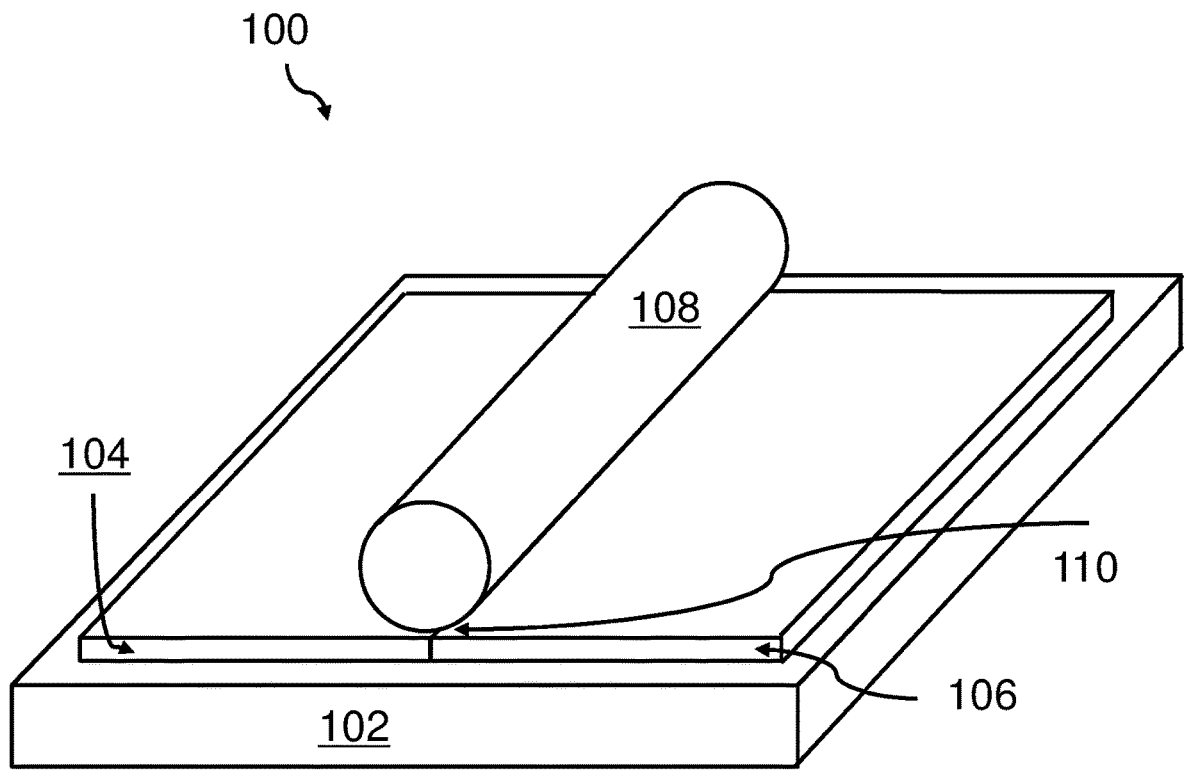

Embodiments of the invention will be described, by way of example only, and with reference to the following drawings:

FIG. 1 shows a block diagram of an embodiment of the inventive plasmonic quantum well laser.

Figure 2:
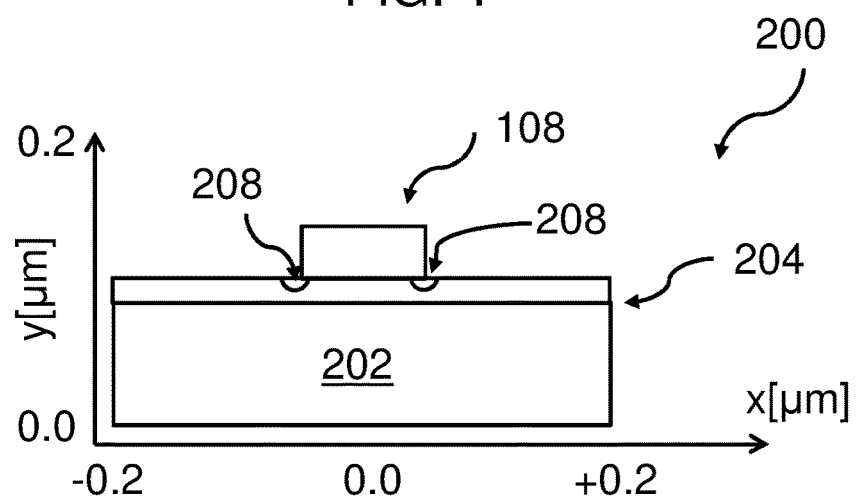

FIG. 2 shows a general schematic illustration of a plasmonic waveguide on top of a horizontally oriented quantum well in an embodiment.

Figure 3:
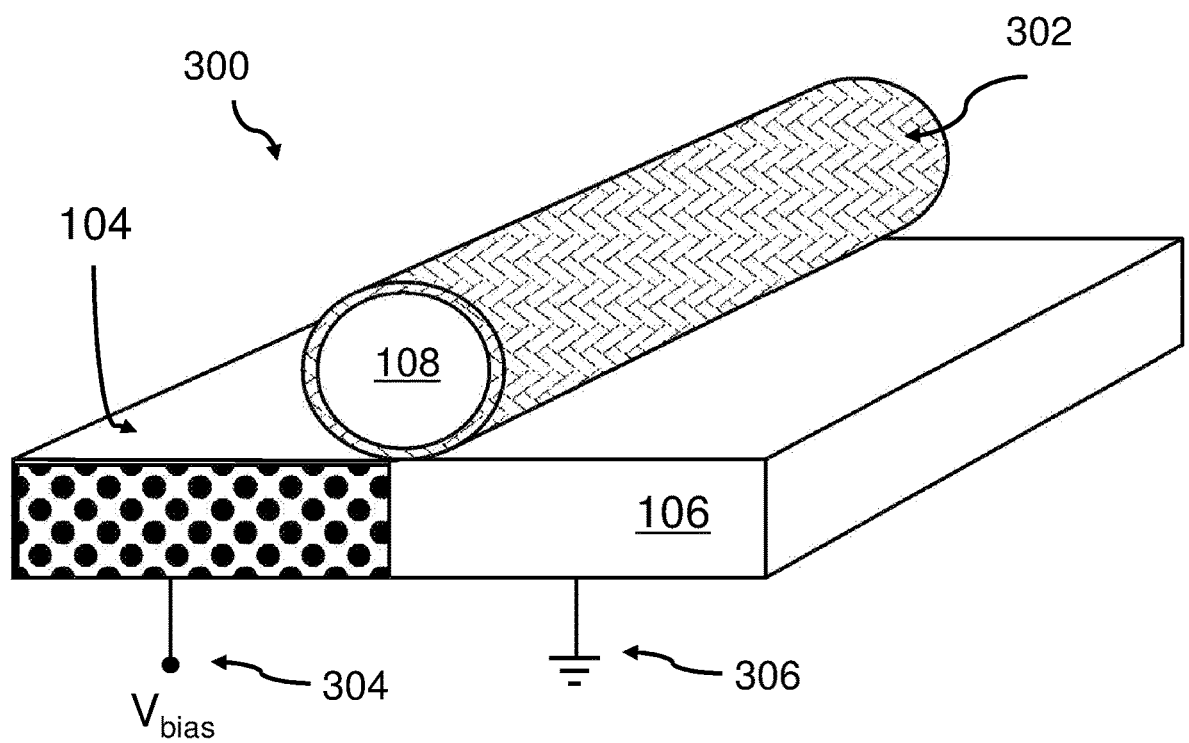

FIG. 3 shows a dielectric coated metallic nano-wire waveguide on a simple p-n junction in an embodiment.

Figure 4:
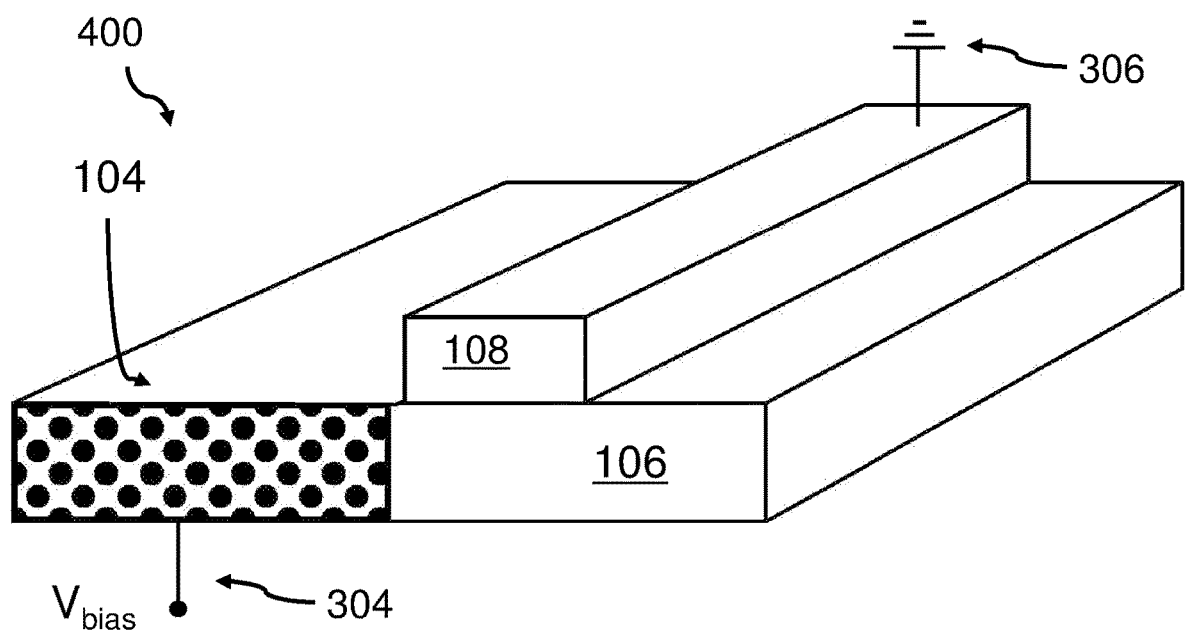

FIG. 4 shows an alternative embodiment, in which the metallic nano-wire is only positioned on one side of the p-n junction.

Figure 5:
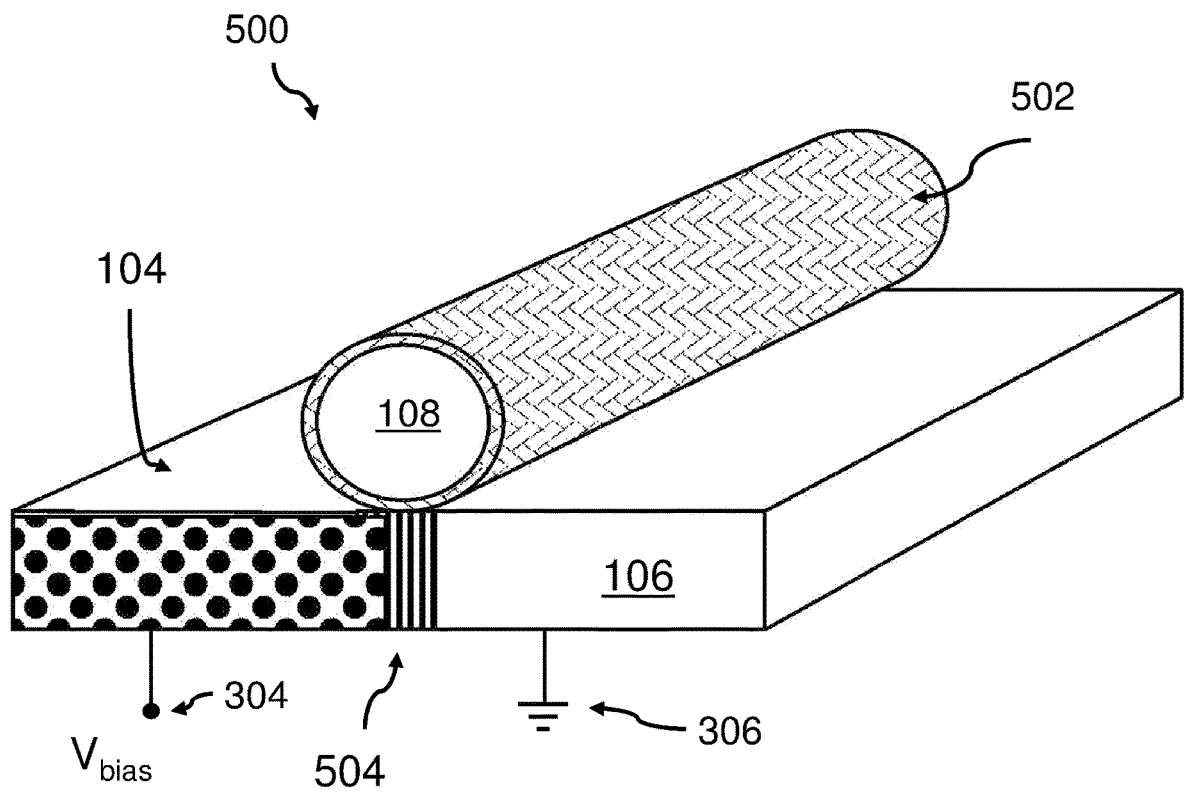

FIG. 5 shows again an alternative embodiment with a metallic nano-wire coated with dielectric material, and positioned on top of a p-n region with multiple quantum wells.

Figure 6:
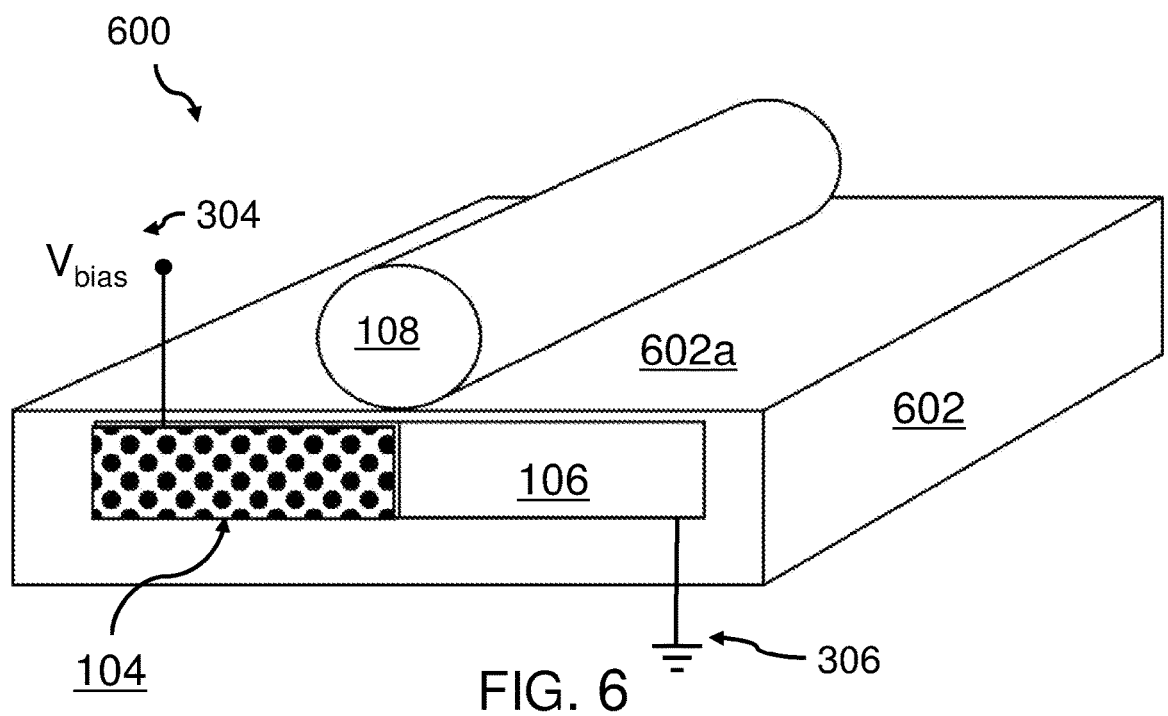

FIG. 6 shows a further alternative embodiment in which a metallic nano-wire waveguide is shown on a layer of very thin dielectric material, positioned on top of a pre-patterned gain material.

Figure 7:
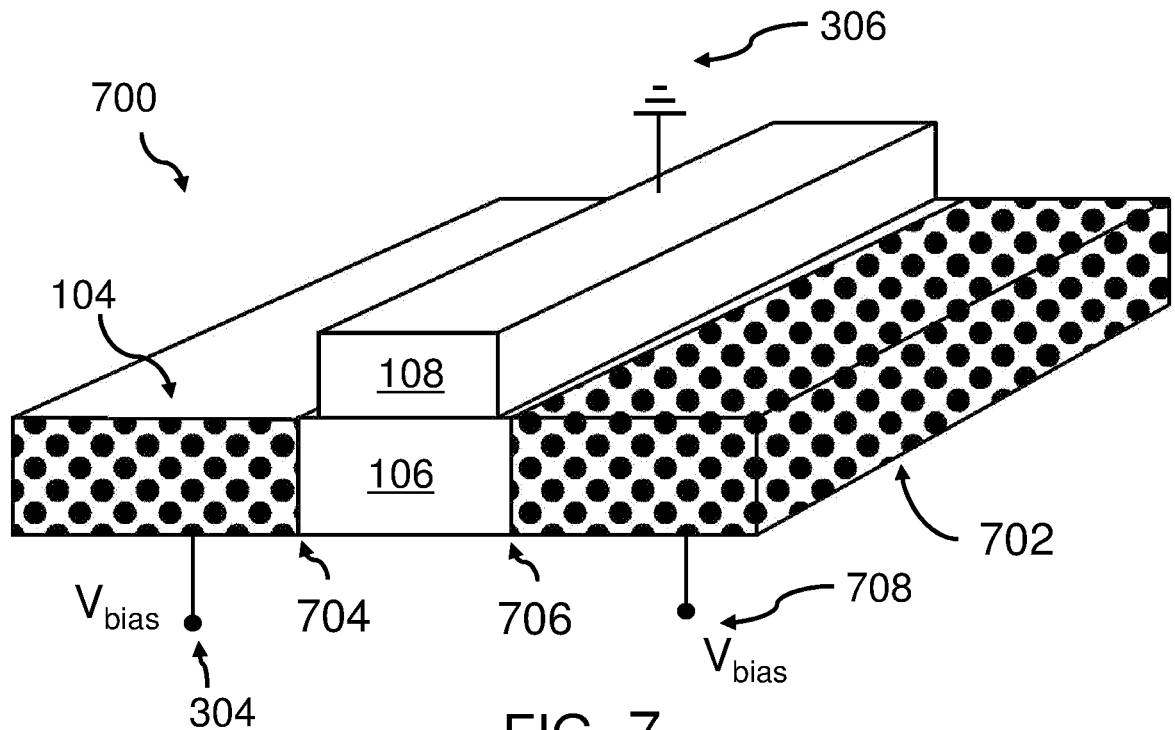

FIG. 7 shows an additional alternative embodiment, wherein the metallic waveguide is positioned on a pnp double junction.

Figure 8:
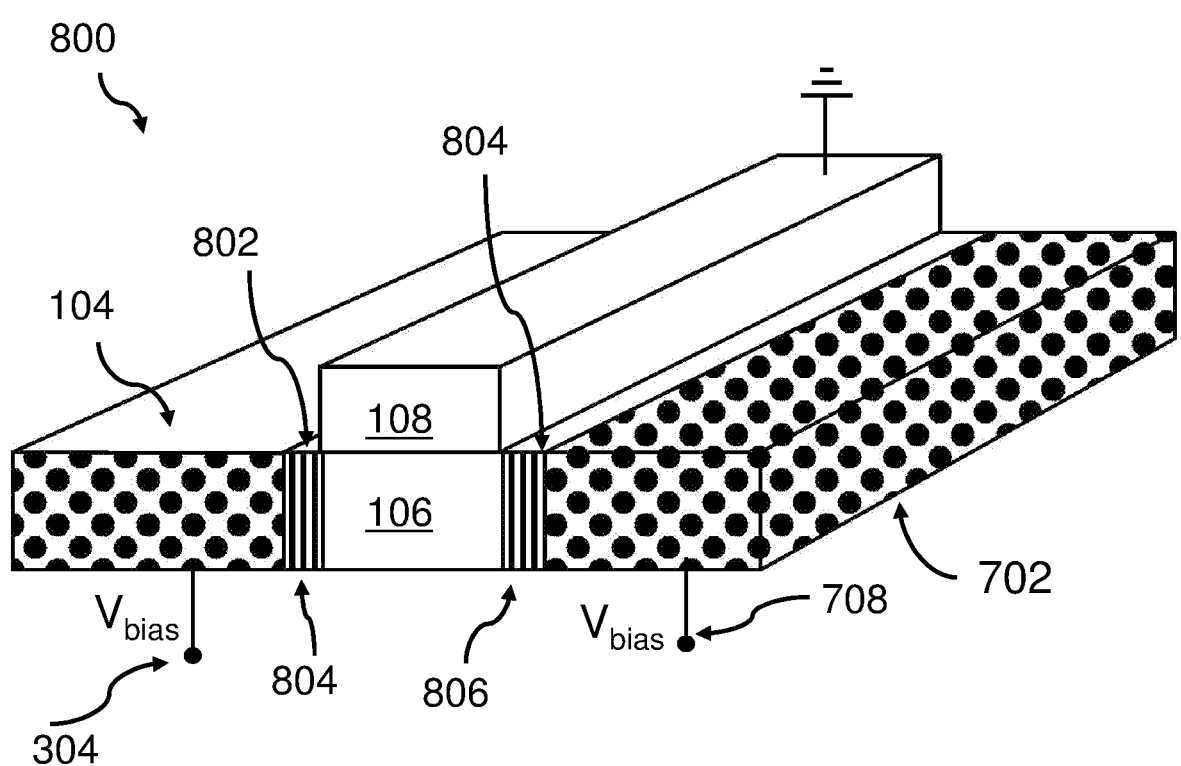

FIG. 8 shows a further implementation option, in which the metallic waveguide is positioned atop a pnp double junction with a plurality of quantum wells in an embodiment.

Figure 9:
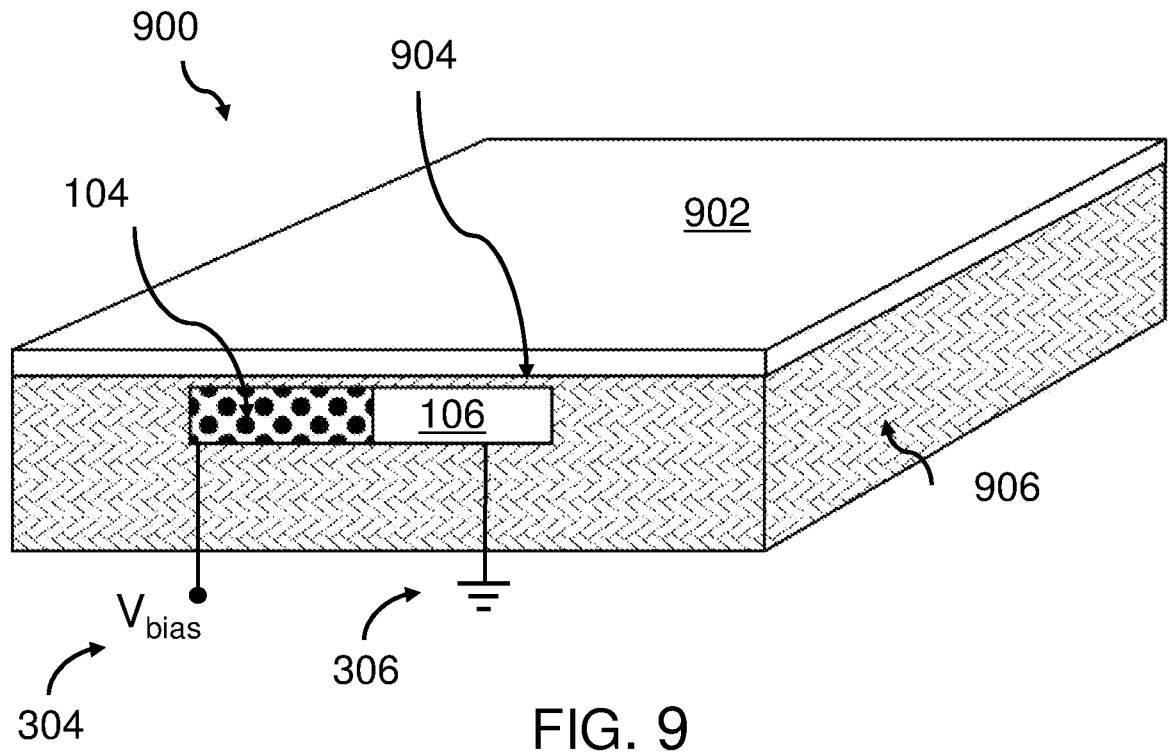

FIG. 9 shows another embodiment with a plane metallic layer over a buried p-n junction.

Figure 10:
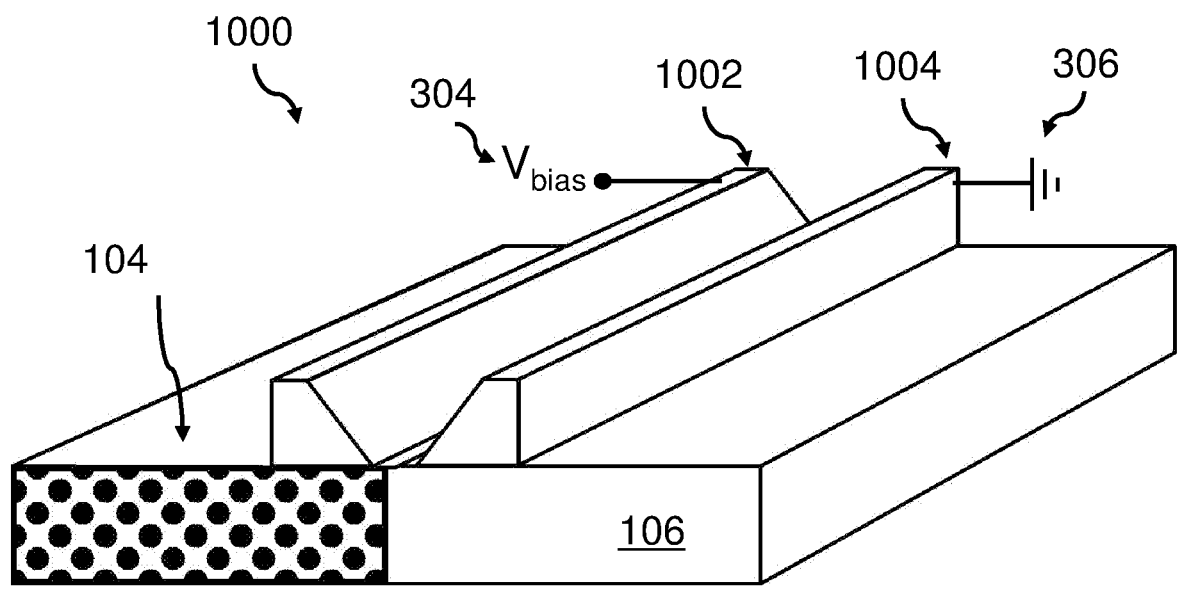

FIG. 10 shows a special embodiment of the quantum well laser with the metallic slot waveguide.

Figure 11:
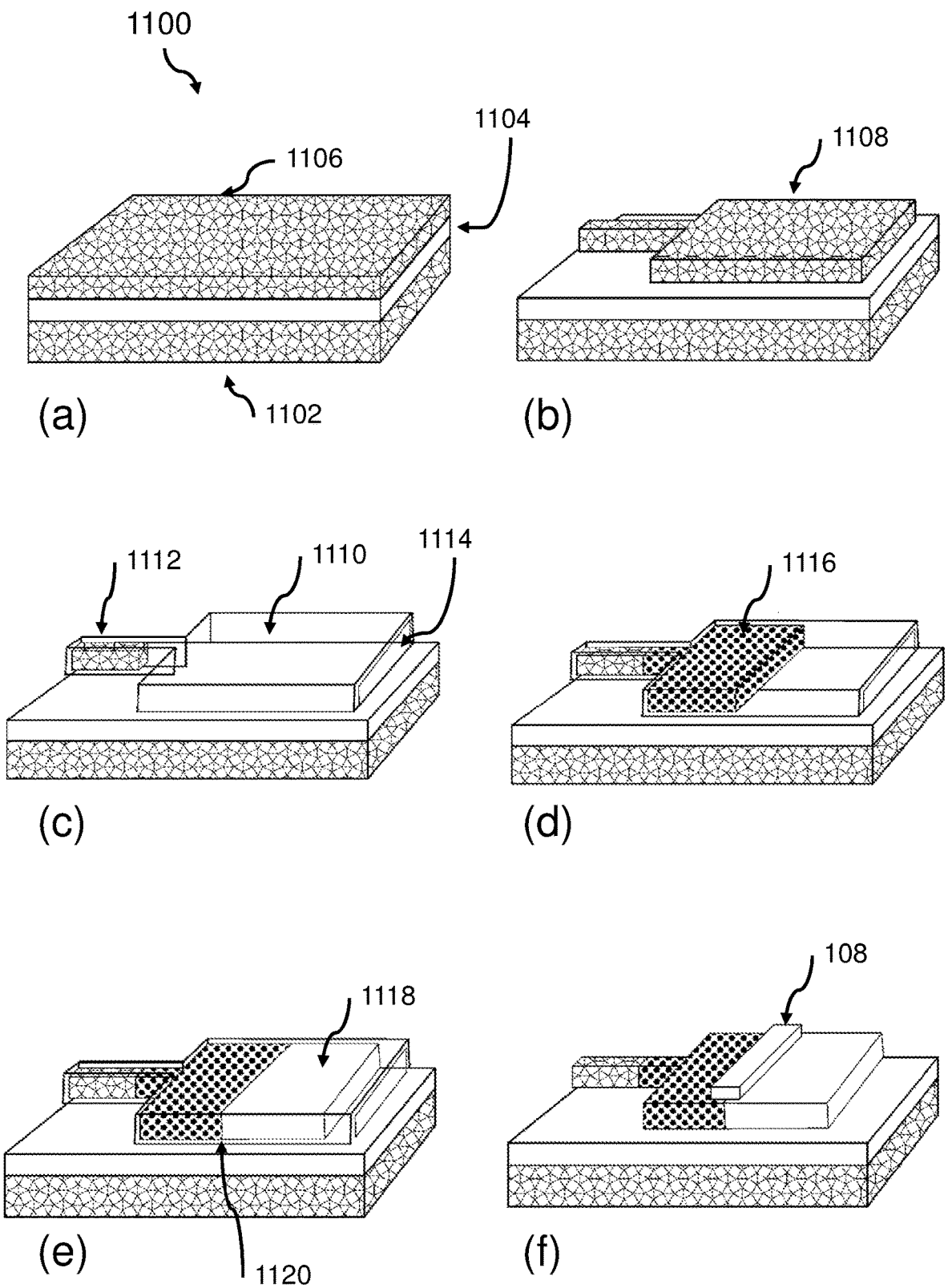

FIG. 11 shows process steps of an embodiment of a method for building the plasmonic quantum well laser using template assisted selective epitaxy.

DETAILED DESCRIPTION

In the context of this description, the following conventions, terms and/or expressions may be used:

The term 'plasmonic quantum well laser' may denote a semiconductor diode or similar in which the active region of the device is so narrow that quantum confinement occurs. The diodes may be formed in compound semiconductor materials that (quite unlike silicon) are able to emit light and, in particular, plasmons efficiently. The wavelength of the light emitted by a quantum well laser may be determined by the width of the active region rather than just the bandgap of the material from which it is constructed. This means that different wavelengths may rather be obtained from quantum well lasers than from conventional laser diodes using a particular semiconductor material. The efficiency of a quantum well laser is also greater than a conventional laser diode due to the stepwise form of its density of states function. However, here the focus is on excited plasmons that may be confined to much smaller regions than related photons. In contrast to typical photon-based lasers (Light Amplification by Stimulated Emission of Radiation), plasmonic quantum well lasers function with plasmons instead of photons. The notion "laser" is also used in this context to the same stimulated emission of radiation—not of photons, but of the quasi-particles plasmons. In this sense, also the term SPASER (semiconductor plasmon amplification of stimulated emission of radiation) may be used as a synonym for 'plasmonic quantum well laser' in the case where the mode would be of plasmonic nature.

For plasmons, it is not the wavelength that gets shorter if compared to related photons. The plasmon may have the same frequency/wavelength as the related light-photon, i.e., they can couple. However, the plasmon may be confined to a much smaller volume and is, therefore, not subject to the diffraction limit of light. The wavelength, or better the resonance frequency, may still be the same and match the gain material wavelength/frequency and the cavity resonance wavelength/frequency, just like a "normal" laser.

The main difference is that there is a stimulated emission of plasmons and not a stimulated emission of photons. One may say that a maser (microwave amplification of stimulated emission of radiation) relates to a laser (photon-based) in the same way as a laser relates to a plasmonic quantum well laser or plasmonic laser.

In the here proposed concept, the term 'quantum well' might be used to describe the nature of the thin semiconductor region underneath the plasmonic waveguide. If the thickness is thin enough to have a quantized density of states (<~20 nm), only a plasmonic mode would be able to be confined to such a structure.

One might also consider a hybrid case of a plasmonic-photonic mode, where energy oscillates between photons and kinetic energy in electrons. In this case, the plasmonic waveguide serves in anchoring the optical mode to the small region of the metal interface, whereas the emission will be in a radiative photonic mode. Which type of mode will dominate in the proposed devices depends on the dimensions. For relatively thin gain regions (~20-100 nm), a conventional photonic mode will not be sustained, but will leak out, whereas a hybrid photonic-plasmonic mode will likely be the most favorable. For extremely scaled gain regions (~2-20 nm) only a pure plasmon mode will likely be possible.

The term quantum well may also be designated to refer to one or more heterojunctions grown extending orthogonally to the plasmonic waveguide and sandwiched in between the n- and the p-region, respectively. If these quantum wells are effectively quantized in two directions then they would, for a quantum wire, lead to further quantization of the energy states.

The term 'plasmon' may denote, in physics, a quantum of plasma oscillation. Just as light (an optical oscillation) consists of photons, the plasma oscillation consists of plasmons. The plasmon may be considered as a quasiparticle since it arises from the quantization of plasma oscillations, just like phonons are quantizations of mechanical vibrations. Thus, plasmons are collective (a discrete number) oscillations of the free electron gas density. For example, at optical frequencies, plasmons may couple with a photon to create another quasiparticle, called a plasmon polariton.

Plasmons are bosons which undergo stimulated emission by coupling to electron-hold pairs (which may be named excitons which are also bosons), e.g., of the gain material. The plasmon quasi-particles that undergo a stimulated emission can exist even below the diffraction limit of the related light (of the same wavelength), i.e., photons. It may also be noted that the dimensions of the active elements (thickness of the gain material or, another relevant quantum well, the plasmonic cavity) lay below the existence of related photons of the same wavelength/frequency.

The term 'plasmonic waveguide' may denote a waveguide for plasmons. A plasmonic waveguide may denote a cavity that may achieve strong plasmon confinement. It may be formed by separating a medium of high refractive index (usually silicon) from a metal surface (usually gold or silver) by a small physical gap. The plasmonic waveguide or plasmonic cavity may enable a high-quality, low loss guidance of excited plasmons.

The term 'dielectric material having a lower refractive index' may denote $SiO_2$, $Al_2O_3$ or another dielectric below the p-n junction gain material. Such dielectric template may be used to define the quantum well dimensions and may serve as optical and electrical isolator to an underlying silicon surface of a used Si substrate.

The term 'dielectric function' may be defined in the context of electromagnetic permittivity or absolute permittivity. It may denote the measure of resistance that is encountered when forming an electric field in a particular medium. More specifically, permittivity describes the amount of charge needed to generate one unit of electric flux in a particular medium. Accordingly, a charge will yield more electric flux in a medium with low permittivity than in a medium with high permittivity. Thus, permittivity is the measure of a material's ability to resist an electric field, not its ability to 'permit' it (as the name 'permittivity' might seem to suggest). As opposed to the response of a vacuum, the response of normal materials to external fields generally depends on the frequency of the field. This frequency dependence reflects the fact that a material's polarization does not respond instantaneously to an applied field. The response must always be causal (arising after the applied field) which can be represented by a phase difference. For this reason, permittivity is often treated as a complex function of the (angular) frequency ω of the applied field. Thus, the dielectric function may have a real and a complex component.

The term 'nano-wire or nano-tube' may denote a thin wire having a diameter of 2 nm to 150 nm, more specifically 10 nm to 100 nm and even more specifically 30 nm to 50 nm. The nano-wire cross-section may take a plurality of forms, like rectangular, squared, round, elliptic, triangle-shaped, etc.

The term 'slot-waveguide' may denote a plasmon waveguide that may guide strongly confined plasmons in a sub-wavelength-scale. The slot-waveguide may consist of two strips or slabs of metal separated by a sub-wavelength-scale gap region and surrounded by low-refractive-index cladding materials. The active gain region is located underneath the gap region of the slot waveguide to maximize the overlap with the strongly localized plasmonic mode in this region. The thin dielectric region underneath the quantum well gain material further enhances the confinement to the active region and leads to a reduction of propagation losses.

The term 'template assisted selective epitaxy process' (TASE) may denote a selective epitaxy process useful for compound semiconductor deposition. In TASE, a hollow structure with openings and containing a well-defined nucleation area is fabricated on a wafer surface. During the epitaxy step, the hollow structure (e.g. template) is filled from the nucleation area up to the openings, replicating the shape of the template with the semiconductor material.

The proposed semiconductor quantum well laser may offer multiple advantages and technical effects:

The proposed plasmonic quantum well laser allows for the confinement of the propagating mode to a very compact region (below the related photon wavelength) which can be designed to overlap with a narrow electrically pumped region, Thereby, assuring a perfect overlap with the optical mode and the region providing gain. Thus, the problem that the size of the (electrical) pump to the gain material typically exceeds the plasmonic mode area, which reduces the lasing efficiency, is successfully addressed. Therefore, an electrically pumped plasmonic nano-laser becomes a reality that may combine the high attainable gain of semiconductor quantum well structures with simulated low-loss plasmon mode to provide highly efficient lasing below the diffraction limit of light. An optimized electrical injection may be enabled by the growth of lateral p-n junctions in quantum wells which may constitute a novel feature of the recently developed template assisted selective epitaxy (TASE). Additionally, the proposed structures are well designed for a monolithic integration on silicon.

A further advantage of the very tight modal confinement may be in the fact that one may place the contact regions closer to the active gain regions without causing excessive losses. This may reduce the overall load capacitance which has been a main contribution to the energy consumption of nanoscale lasers. As a consequence of a reduction of the energy consumption, required power lines may be reduced in its cross section area which may be instrumental for increasing the integration density as well as a reduction in produced heat.

It may also be mentioned that the plasmonic waveguide or plasmonic cavity may enable a mode confinement of the plasmons below the diffraction limit and the plasmonic feedback for lasing operations. Furthermore, the dielectric template comprising $SiO_2$ below the lasing p-n junction may be used for defining the quantum well dimensions and may serve as optical and electrical isolator to the silicon surface underneath. The quantum well structure itself may provide strongly enhanced gain due to the density of states modification in the region of the p-n junction.

In other words: The plasmonic components may allow for confining the plasmonic mode to much smaller dimensions on the order of 10s of nm, as the metal anchors the plasmonic mode. Thus, this enables photonic sub-wavelength—i.e., plasmonic components. The present concept therefore exploits the strong confinement afforded by the plasmonic mode to assure an optimum overlap with the semiconductor region providing gain by electrical stimulation. The device gets smaller.

In the following, additional embodiments of the plasmonic quantum well laser will be described:

According to one advantageous embodiment of the plasmonic quantum well laser, the p-n junction may extend along an entire length of the plasmonic waveguide. This may allow using the so generated plasmons for information and data communication purposes on highly integrated electronic circuits.

According to one embodiment of the plasmonic quantum well laser, an additional quantum well is positioned between a p-region and an n-region of the p-n junction. This way, the electrically actuated generation may happen in a clearly defined small area which may allow a good confinement with the plasmonic waveguide.

According to one permissive embodiment of the plasmonic quantum well laser, the dielectric material may comprise $SiO_2$ positioned over a silicon substrate. Thus, the prerequisite that the gain material—i.e., the p-n junction—is located on a material with lower refractive index may be fulfilled. Silicon substrates are standard substrates for VLSI circuits anyway and the Si wafer or substrate may easily be coated with $SiO_2$ so to form the basis for the here proposed semiconductor quantum well laser.

According to one additional embodiment of the plasmonic quantum well laser, the plasmonic waveguide may be positioned above or atop the p-n junction. A thin dielectric material, like a thin $Al_2O_3$, $HfO_2$ or $SiO_2$ layer, may separate the p-n junction from the plasmonic waveguide which may typically comprise a metal in order to avoid a shortcut over the r-region and the n-region. However, the thin dielectric material may be built using different approaches: the plasmonic waveguide may be covered with the dielectric or the thin dielectric material may cover the p-n junction. The thickness of the thin dielectric material may be in the range of 1 to 5 nm and more specifically in the range of 2 to 3 nm.

Such a thin layer may enable a good plasmoninc confinement to the plasmonic waveguide, but with manageable losses.

According to one alternative embodiment of the plasmonic quantum well laser, the plasmonic waveguide may be positioned above or atop—i.e., having electrical contact—one of the regions of the p-n junction. This way, it may be possible to use the plasmonic waveguide as an electrical contact to the region of the p-n junction it may be in contact with. This may avoid more complex electrical contacts.

According to one possible embodiment of the plasmonic quantum well laser, the plasmonic waveguide may be a nano-wire. The nano-wire may have a rectangular form wire, a triangle or a trapezoid form. This may allow a good confinement of the plasmon at edges facing the p-n junction. Alternatively, a nano-tube (or a round nano-wire) may be used as plasmonic waveguide. The thickness of the waveguide may be in the range of 5 to 150 nm and, more specifically in the range of 10 to 100 nm, and even more specific in the range of 30 to 50 nm.

According to one permissive embodiment of the plasmonic quantum well laser, the plasmonic waveguide may be a thin 2-D metal layer. The thickness of the thin quasi-2-D metal layer may be in a range of 1-20 nm. This may allow a confinement of the plasmon along the p-n junction below the metal layer. An embodiment of this kind may easily be fabricated because no additional, more complex structures of a 3D waveguide or a nano-wire may be required.

According to different embodiments of the semiconductor quantum well laser, the p-n junction structure may be one selected out of a group comprising a lateral p-n junction structure, a lateral p-n-p structure, a lateral p-i-n-i-p structure, a lateral p-NBG-n structure, and a lateral p-LBG-n-LBG-p structure, wherein p represents a p-doped semiconductor, n represents a n-doped semiconductor, i represents an intrinsic semiconductor, NBG represents a semiconductor with a narrow band gap. It may also be mentioned that the sequence of the p- and n-region may be exchangeable.

Exemplary, useful semiconductor for building the p-n junction may comprise III-V semiconductors, like InGaAs, GaAs, GaInP, AlGaAs, and similar or, III-N junctions, e.g., GaN, as well as II-VI semiconductor junction. It may be clear to a skilled person that the symbols II, III, V and VI may denote one of the main groups of chemical elements.

According to a further embodiment of the semiconductor quantum well laser, all junctions—in particular, all p-n junctions of the structures may be oriented orthogonally to a longitudinal extension of the plasmonic waveguide. This may allow a good confinement to the structure of the plasmonic waveguide. It may also allow a narrow quantum well(s) between the p- and the n-region, which may in turn result in comparably low pump power requirements.

According to one useful embodiment of the semiconductor quantum well laser, the plasmonic waveguide material may comprise plasmonic metal—e.g. gold, silver or TiN or a highly doped semiconductor—such that the dielectric function of the plasmonic waveguide material has a negative real portion of a related dielectric function. Again, this may allow the propagation of a surface plasmon polariton (SPP) mode. As a reminder: a plasmonic metal may be a material having a negative portion of its dielectric function.

According to one practical embodiment of the semiconductor quantum well laser, the plasmonic waveguide may be a slot-waveguide, wherein one portion (one rail) of the slot-waveguide may be positioned above or atop-atop meaning in direct electrical contact—an n-region of the p-n junction and another portion (the other rail) of the slot-waveguide may be positioned above or atop a p-region of the p-n junction, wherein the slot-waveguide confining an electromagnetic field to the p-n junction. With the portion being positioned directly in electrical contact with the regions of the p-n junction, the individual portion may be directly used as electrical contacts to the regions itself. No additional electrical contacts to the regions of the junction structure may be required. This may save costly space in the LSI circuit.

According to one advantageous embodiment of the semiconductor quantum well laser, the semiconductor quantum well laser is a result of a template assisted selective epitaxy (TASE) process. This process may be instrumental to fabricate the required thin semiconductor layer for the p-n junction(s). The so laterally grown p-n junction represents a unique feature of the TASE process which enables a strong overlap of the plasmon mode with the p-n recombination zone.

A growth seed used to fabricate the laterally grown p- and n-regions of the p-n junction may enable a monolithic integration of optically active semiconductor material on silicon as electrical contacts.—According to an alternative advantageous embodiment of the plasmonic quantum well laser, the semiconductor quantum well may be fabricated by epitaxy and layer transfer.

In the following, a detailed description of the figures will be given. All instructions in the figures are schematic. Firstly, a block diagram of an embodiment of the inventive semiconductor quantum well laser is given. Afterwards, further embodiments, as well as embodiments of the method for building a semiconductor quantum well laser, will be described.

FIG. 1 shows a block diagram of an (sort of abstract) embodiment of the inventive semiconductor quantum well laser including a plasmonic waveguide. A semiconductor quantum well laser 100 including a plasmonic waveguide 108 comprises a p-n junction structure 104, 106 extending orthogonally to a direction of plasmon propagation along the plasmonic waveguide 108—i.e., from the font to the back of the 3D sketch of the shown structure (or back). Thereby, the p-n junction 104, 106 is positioned atop a dielectric material 102 having a lower refractive index—e.g., $SiO_2$—than material building the p-n junction (like the mentioned III-V, and I-VI semiconductor material examples mentioned above). The quantum well laser is electrically pumpable via electrical contact to the p-region 104 and the n-region 106 of the p-n junction structure. It may be noted that in the recombination area 110 no electrical contact of the plasmonic waveguide 108 to the p-region 104 and/or the n-region 106 is enabled in order to avoid an electrical shortcut between then p-region 104 and the n-region 106.

FIG. 2 shows a general schematic illustration 200 of a plasmonic waveguide 108 on top of a horizontally oriented quantum well layer in which the quantum well is typically oriented vertically to the plasmonic waveguide 108. The quantum well 204 layer may, e.g., be implemented as a III-V gain material over a low index dielectric material 202 (e.g., in form of $SiO_2$). On top of the quantum well, the plasmonic waveguide 108 is shown schematically as a rectangle. The plasmonic waveguide 108 may be surrounded on three sides (not the lower side facing the quantum well) by natural air or vacuum. In such a setup, simulations show that plasmons 208 can be strongly confined to the very thin (few nm) layer of gain material 204 if the gain material 204 is sandwiched between a low index dielectric 202 and the proximal plasmonic waveguide 108. It can be shown that the plasmonic mode 208 is strongly confined to the lower edges of the plasmonic waveguide 108 within the quantum well gain material. It is also assumed that the quantum well has a comparably high refractive index—in particular, if compared to the comparable low index of the underlying $SiO_2$. It may be clear to a skilled person that the plasmonic waveguide may not be in direct contact with both sides of a p-n junction in the III-V gain material (because it may cause a shortcut). Details are shown in the following, more realistic embodiments. The coordinate system, integrated into FIG. 2, may give an indication of the dimensions of the plasmonic waveguide 108 and of a quantum well in the gain material 204.

FIG. 3 shows an embodiment 300 with a metallic nano-wire waveguide 108 on a simple p-n junction 104, 106. The metallic nano-wire waveguide 18 may be surrounded by or coated with a thin (few nm, e.g., 1 to 5 nm) dielectric material 302—e.g., $SiO_2$—separating the metal of the metallic nano-wire waveguide 108 and the p-n junction 104, 106 to avoid an electrical shortcut over the p-n junction. A voltage $V_{bias}$ and a ground connection are also shown. The p-n junction is formed by a p-region 104 and an n-region 106. Also shown are a pump voltage $V_{bias}$ connection 304 to the p-region 104, as well as a ground connection 306 to the n-regions 106.

FIG. 4 shows an alternative embodiment 400 in which the metallic nano-wire waveguide 108 is only positioned on one side of the p-n junction, here the n-region 106. In this case, it is not necessary to separate the metallic nano-wire of the metallic nano-wire waveguide 108 from the semiconductor quantum well layer composed of the p-n junction layer 104, 106. In this case, the metallic waveguide may be used as a ground connection 306 while the voltage $V_{bias}$ requires a separate connection to the p-region 104 of the p-n junction 104, 106 structure. This embodiment is a technologically simple implementation, but is less advantageous from a performance perspective as only the plasmon mode close to the junction has an optimal overlap with the pumped region.

FIG. 5 shows again an alternative embodiment 500 with the metallic nano-wire waveguide being coated with a dielectric 502, e.g., $SiO_2$. In this case, a plurality of quantum wells 504 (or only one) is shown between the p-region 104 and the n-regions of the p-n junction as vertical stripes between the p- and the n-region of the junction structure.

FIG. 6 shows a further alternative embodiment 600 in which the nano-wire waveguide 108 is shown on a very thin dielectric material 602a, and the gain material containing the p-n junction is buried underneath. The gain material—i.e., the p-region 104 and the n-region 106—may be buried in the $SiO_2$ bed 602.

FIG. 7 shows an additional alternative embodiment 700, wherein the metallic waveguide 108 (exemplary shown with a rectangular the cross-section) is a double junction, i.e., a pnp-junction. An advantage of such architecture is that the metallic waveguide 108 may be positioned directly atop and in electrical contact with the middle n-region. It may be used as ground connection 306. $V_{bais}$ connections 304, 708 are connected to the p-regions 104 and the additional p-region 702. It may be clear that instead a pnp double junction also an npn double junction may be used.

FIG. 8 shows a further implementation option 800 in which the metallic waveguide 108 is positioned atop a pnp double junction with vertically oriented quantum well regions 802, 804 at the individual p-n junction 704 and the n-p junction 706. The figure shows also clearly the additional p-region 702. Also here, it may be clear that instead a pnp double junction also an npn double junction may be used.

FIG. 9 shows another embodiment 900 as a plane metallic layer 902 on a dielectric material layer 904. This layer 904 may also be in contact with the burying material 906 burying the p-n junction 104, 106 which defines the gain region of the semiconductor laser. This way, the propagating plasmons will be concentrated over the recombination area of the p-n junction structure 104, 106. In this case the laser cavity is determined by the geometrical extension of the buried gain region (=p-n junction 104,106), rather than by patterning the plasmonic waveguide.

FIG. 10 shows a special embodiment 1000 with the metallic slot waveguide. Here, the plasmon field propagates in the opening between the two triangle shaped partial waveguides 1002, 1004, i.e., in the opening between the partial waveguides 1002, 1004. Each side of the slot serves additionally the purpose of functioning as a metallic contact to the p- and the n-region, respectively.

FIG. 11 shows process steps of an embodiment 1100 of a method for building the plasmonic quantum well laser, using the Template-Assisted Selective Epitaxy (TASE). This will be explained shortly: Firstly, referring to FIG. 11(a), an SOI wafer (Si-bulk material 1102 under $SiO_2$-layer 1104 topped by a Si layer 1106), thinned to the desired thickness of the gain material. If the later built gain material is thin enough (<~20 nm) this also acts as a quantum well.

Secondly, referring to FIG. 11(b), a pattern 1108 for defining the shape of the laser gain material (to be grown later on) is patterned into the top silicon layer 1106 by conventional lithographic patterning techniques.

Thirdly, referring to FIG. 11(c), the entire structure is covered with an oxide (not shown, $SiO_2$, or other dielectric template layer), which is opened on one end 1114 to selectively etch away part of the silicon, thereby creating a hollow template cavity 1110. At one extremity of the cavity a narrow ~20-100 nm wide silicon seed 1112 is exposed.

In a next step, referring to FIG. 11(d), one side or portion 1116 of the p-n junction (e.g., a p-region) is epitaxially grown extending from the silicon seed 1112. In a further step, referring to FIG. 11(e), the other polarity side or portion 1118 (e.g., an n-region) of the p-n junction 1120 is grown, thereby completing the gain region of the plasmonic quantum well laser. The cavity may be completely filled or it may be filled until the desired expansion is obtained. The growth of the p-junction is likely done in one step with a variation of precursor gasses. In-between the two regions 1116, 1118 of the p-n junction 1120 one may incorporate— an un-doped i-region, a heterojunction, or a second quantum well according to the embodiments (compare, e.g., FIG. 5, FIG. 8). Last but not least, referring to FIG. 11(f), the template oxide is stripped away and the plasmonic waveguide 108 is patterned as described in more detail in the context of the previous figures. Electrical contact can be provided to the regions of the p-n junction and/or the plasmonic waveguide 108 as described in the context of the previous figures.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A plasmonic quantum well laser comprising a plasmonic waveguide, said plasmonic quantum well laser comprising
    a p-n junction structure extending orthogonally to a direction of plasmon propagation along said plasmonic waveguide,
    wherein said p-n junction is positioned atop a dielectric material having a lower refractive index than material building said p-n junction, and
    wherein said plasmonic quantum well laser is electrically actuated.

2. The plasmonic quantum well laser according to claim 1, wherein said p-n junction extends along an entire length of said plasmonic waveguide.

3. The plasmonic quantum well laser according to claim 1, wherein an additional quantum well is positioned between a p-region and an n-region of said p-n junction.

4. The plasmonic quantum well laser according to claim 1, wherein said dielectric material comprises $SiO_2$ positioned over a silicon substrate.

5. The plasmonic quantum well laser according to claim 1, wherein said plasmonic waveguide is positioned above or atop said p-n junction.

6. The plasmonic quantum well laser according to claim 1, wherein said plasmonic waveguide is positioned above or atop one of said regions of said p-n junction.

7. The plasmonic quantum well laser according to claim 1, wherein said p-n junction and said plasmonic waveguide are separated by a thin dielectric material.

8. The plasmonic quantum well laser according to claim 1, wherein said plasmonic waveguide is a nano-wire or a nano-tube.

9. The plasmonic quantum well laser according to claim 1, wherein said plasmonic waveguide is a thin 2-D metal layer.

10. The plasmonic quantum well laser according to claim 1, wherein said p-n junction structure is one selected out of a group comprising a lateral p-n junction structure, a lateral p-n-p structure, a lateral p-i-n-i-p structure, a lateral p-NBG-n structure, and a lateral p-NBG-n-NBG-p structure, wherein
    p represents a p-doped semiconductor,
    n represents a n-doped semiconductor
    i represents an intrinsic semiconductor
    NBG represents a semiconductor with a narrow band gap.

11. The plasmonic quantum well laser according to claim 10, wherein all junctions of said structures are oriented orthogonally to a longitudinal extension of said plasmonic waveguide.

12. The plasmonic quantum well laser according to claim 1, wherein said plasmonic waveguide material comprises metal, wherein said dielectric function of said plasmonic waveguide material has a negative real portion of a related dielectric function.

13. The plasmonic quantum well laser according to claim 1, wherein said plasmonic waveguide is a slot-waveguide, wherein one portion of said slot-waveguide is positioned above or atop an n-region of said p-n junction and another portion of said slot-waveguide is positioned above or atop a p-region of said p-n junction, said slot-waveguide confining an electromagnetic field to said p-n junction.

14. The plasmonic quantum well laser according to claim 1, wherein said semiconductor quantum well laser is a result of a template assisted selective epitaxy process.

15. A method for building a plasmonic quantum well laser, said method comprising providing an $SiO_2$ layer over an Si bulk material, wherein an Si layer is deposited atop of said $SiO_2$ layer;
    patterning an Si structure allotted for a gain region into said Si layer, such that said Si structure forms a pattern atop said $SiO_2$ layer;
    covering said Si structure with an $SiO_2$ template layer;
    building an opening in said $SiO_2$ template layer from one side and etching away said Si pattern, saidreby building a cavity within said $SiO_2$ template layer;
    epitaxially growing horizontally a first semiconductor portion of a p-n junction extending from a silicon seed exposed within said SiO$_2$ template towards said opening until a predefined horizontal extension is reached;

growing horizontally a second portion of said p-n junction through said opening extending from an end of said predefined horizontal extension facing said opening until said cavity is filled, such that said p-n junction builds said gain region of said plasmonic quantum well laser;

depositing a dielectric material over said p-n junction; and depositing a plasmonic waveguide over said dielectric material along a longitudinal extension of said p-n junction.

\* \* \* \* \*